US008342707B2

(12) United States Patent
Wu (10) Patent No.: US 8,342,707 B2
(45) Date of Patent: Jan. 1, 2013

(54) MULTI-WAVELENGTH LIGHT-EMITTING MODULE

(75) Inventor: Ming-Che Wu, Nan-Tou (TW)

(73) Assignees: Universal Scientific Industrial (Shanghai) Co., Ltd., Shanghai (CN); Universal Global Scientific Industrial Co., Ltd., Nantou County (TW)

( * ) Notice: Subject to any disclaimer, the term of this patent is extended or adjusted under 35 U.S.C. 154(b) by 479 days.

(21) Appl. No.: 12/071,112

(22) Filed: Feb. 15, 2008

(65) Prior Publication Data

US 2009/0079943 A1    Mar. 26, 2009

(30) Foreign Application Priority Data

Sep. 21, 2007   (TW) .............................. 96135278 A (51) Int. Cl.
*F21V 9/00* (2006.01)
(52) U.S. Cl. ........................................ 362/231; 362/800
(58) Field of Classification Search .................. 362/231, 362/800; 257/98, 99, 100, 431–448
See application file for complete search history.

(56) References Cited

U.S. PATENT DOCUMENTS

| | | | | |
|---|---|---|---|---|
| 5,617,131 | A | * | 4/1997 | Murano et al. ................ 347/233 |
| 6,045,240 | A | * | 4/2000 | Hochstein ..................... 362/294 |
| 6,194,960 | B1 | * | 2/2001 | Nagumo ........................ 327/565 |
| 6,243,401 | B1 | * | 6/2001 | Lee ................................. 372/20 |
| 6,739,735 | B2 | * | 5/2004 | Meyer et al. ................... 362/237 |
| 7,173,757 | B2 | * | 2/2007 | Kim et al. ...................... 359/344 |

FOREIGN PATENT DOCUMENTS

| | | | |
|---|---|---|---|
| JP | 35614790 | * | 11/1981 |
| JP | 363108770 | * | 5/1988 |

* cited by examiner

*Primary Examiner* — Jong-Suk (James) Lee
*Assistant Examiner* — Mark Tsidulko
(74) *Attorney, Agent, or Firm* — Li&Cai Intellectual Property (USA) Office (57) ABSTRACT

A multi-wavelength light-emitting module that includes a PCB, a drive IC structure, a conductive structure, a multi-wavelength LED array set, a plurality of conductive elements, and an optical amplifier structure. The PCB has at least one input/output pad. The drive IC structure is disposed on the PCB and having at least one concave groove formed on top surface thereof. The conductive structure is electrically connected between the drive IC structure and the at least one input/output pad. The multi-wavelength LED array set is received in the at least one concave groove. The conductive elements are electrically connected between drive IC structure and the multi-wavelength LED array set, respectively. The optical amplifier structure is disposed over the multi-wavelength LED array set for receiving light sources from the multi-wavelength LED array set.

12 Claims, 10 Drawing Sheets

```
┌─────────────────────────────────────────────────────────┐
│ providing a wafer that has been patterned, and the wafer│
│ having a plurality of drive IC structures and each drive│
│ IC structure having a plurality of drive IC pads        │
└─────────────────────────────────────────────────────────┘ ─── S100
    ┌──────────────────────────────────────────┐
    │ forming at least one concave groove on   │
    │ a top side of the drive IC structure     │ ─── S102
    └──────────────────────────────────────────┘
     ┌───────────────────────────────────────────────────┐
     │ receiving the multi-wavelength LED array set in the at
     │ least one concave groove via an adhesive unit, the
     │ multi-wavelength LED array set having three wavelength
     │ LED arrays and each LED array having a plurality of LED
     │ pads corresponding to the drive IC pads and a plurality
     │ of LED dies electrically connected to the LED pads
     └───────────────────────────────────────────────────┘ S104
        ┌────────────────────────────────────────────┐
        │ forming an insulative layer on the drive IC │
        │ structure and the multi-wavelength LED array set │ S106
        └────────────────────────────────────────────┘
        ┌──────────────────────────────────────────────┐
        │ patterning the insulative layer to form a patterned
        │ insulative layer for covering over the two first  │ S108
        │ width gaps, covering over the two second width gaps,
        │ and exposing the drive IC pads and the LED pads │ S110
        └──────────────────────────────────────────────┘
 ┌────────────────────────────────────────────────────────┐
 │ forming each liquid conductive material between each two
 │ corresponding LED pads and between each corresponding drive
 │ IC pad and each corresponding LED pad via printing or coating
 └────────────────────────────────────────────────────────┘
    ┌──────────────────────────────────────────────┐
    │ solidifying the liquid conductive materials to make the
    │ liquid conductive materials become the conductive elements
    └──────────────────────────────────────────────┘
        ┌────────────────────────────────────────────┐
        │ removing a part of the patterned insulative │
        │ layer formed on the multi-wavelength LED    │ S112
        │ array set in order to expose the LED dies   │ S114
        └────────────────────────────────────────────┘
 S1  ┌──────────────────────────────────────────┐
     │ each multi-wavelength LED array          │
     │ package module is cut from the wafer    │ ─── S116
     └──────────────────────────────────────────┘
     ┌──────────────────────────────────────────┐
FIG. 1│ arranging the drive IC structure on a PCB│ ─── S118
     │ that has at least one output/input pad  │
     └──────────────────────────────────────────┘
     ┌──────────────────────────────────────────┐
     │ forming a conductive structure electrically
     │ connected between the drive IC structure │
     │ and the at least one output/input pad    │ ─── S120
     └──────────────────────────────────────────┘
```

MULTI-WAVELENGTH LIGHT-EMITTING MODULE

BACKGROUND OF THE INVENTION

1. Field of the Invention

The present invention relates to a multi-wavelength light-emitting module, and particularly relates to a multi-wavelength light-emitting module that has a plurality LED array with different wavelengths sharing an optical system of an optical amplifier.

2. Description of the Related Art

In the typical printer technology, a laser is used as a light source in a printer head to scan and transfer the printing information as light signals to a rotating drum in order to generate electrostatic latent images formed on the rotating drum. Moreover, the printing method further includes a toner absorbing step, a transferring step, a hot pressing step, an electrostatic discharging step etc. to achieve printing. However, a laser printer head of the prior art has many optical components, and the mechanism of the laser printer head is complex and the optical path of the laser printer head is very long. Hence, the optical structure is quite complex and difficult to reduce in size when using a laser as light source. Therefore, the current trend is toward using light emitting diodes to replace lasers as light sources in printer heads, which can simplify the optical structure.

A further requirement is to reduce the volume of each light emitting diode so as to increase the resolution of the printer. The number of light emitting diodes per unit area in the printer head can be increased when the volume of each light emitting diode is reduced. According to the typical packaging method, a highly precise packaging apparatus is required to arrange the light emitting diode arrays and the driver integrated circuits so that they are exactly parallel to each other in a printed circuit board. Then, if the resolution of the printer is 600 dpi (dots per inch) on A4 size paper, about 5000 wires are formed between the light emitting diode arrays and the driver integrated circuits by means of a wire bonding process. The driver integrated circuits drive the light emitting diode arrays through these wires.

The necessity for a highly exact and dense wire bonding process in the foregoing method increases the difficulty of the packaging process. This reduces the product yield and indirectly raises manufacturing costs. Moreover, the above-mentioned technology of the prior art can not manufacture electrical connections with high density between an LED (Light Emitting Diode) array and a drive IC (Integrated Circuit) array, so a packaged multi-wavelength light-emitting module of the prior art that has a plurality LED array sets with different wavelengths can not share an optical system of an optical amplifier. In other words, each LED array set of the prior art needs to mate with a corresponding optical amplifier. This increases the size of the packaged multi-wavelength light-emitting module of the prior art, and thus also increases the size of printers using the packaged multi-wavelength light-emitting module of the prior art

SUMMARY OF THE INVENTION

One particular aspect of the present invention is to provide a multi-wavelength light-emitting module in order to reduce product size and manufacturing costs.

In order to achieve the above-mentioned aspects, the present invention provides a multi-wavelength light-emitting module that includes a PCB, a drive IC structure, a conductive structure, a multi-wavelength LED array set, a plurality of conductive elements, and an optical amplifier structure.

The PCB has at least one input/output pad. The drive IC structure is disposed on the PCB and has at least one concave groove formed on top surface thereof. The conductive structure is electrically connected between the drive IC structure and the at least one input/output pad. The multi-wavelength LED array set is received in the at least one concave groove. The conductive elements are electrically connected between drive IC structure and the multi-wavelength LED array set, respectively. The optical amplifier structure is disposed over the multi-wavelength LED array set for receiving light sources from the multi-wavelength LED array set.

Hence, the present invention is different from the prior art. The present invention provides the conductive structure for electrically connecting between the multi-wavelength LED array set and the drive IC structure and between each two LED arrays. Hence, the present invention not only can reduce product size, material cost, and manufacturing cost, but also uses the same optical amplifier such as a SLA (semiconductor laser amplifier) for reducing the size of an optical module of a printer.

It is to be understood that both the foregoing general description and the following detailed description are exemplary, and are intended to provide further explanation of the invention as claimed. Other advantages and features of the invention will be apparent from the following description, drawings and claims.

BRIEF DESCRIPTION OF THE DRAWINGS

The various objects and advantages of the present invention will be more readily understood from the following detailed description when read in conjunction with the appended drawings, in which.

DETAILED DESCRIPTION OF THE PREFERRED EMBODIMENTS

Referring to FIGS. 1 to 4 and 5A to 5G, the first embodiment of the present invention provides a multi-wavelength light-emitting module. The method of the first embodiment includes: referring to FIGS. 2 to 4, providing a wafer W that has been patterned, and the wafer having a plurality of drive IC (Integrated Circuit) structures 1 and each drive IC structure 1 having a plurality of drive IC pads 10 (S100); and forming at least one concave groove 11 (that is a receiving space) on a top side of the drive IC structure 1 (S102). The drive IC pads 10 are straightly arranged near two sides of the at least one concave groove 11 and on the drive IC structure 1.

Referring to FIGS. 5A to 5G again, step S1 discloses the manufacturing processes of each drive IC structure 1. Step S1 includes step S104 to step S114.

Figure 1:
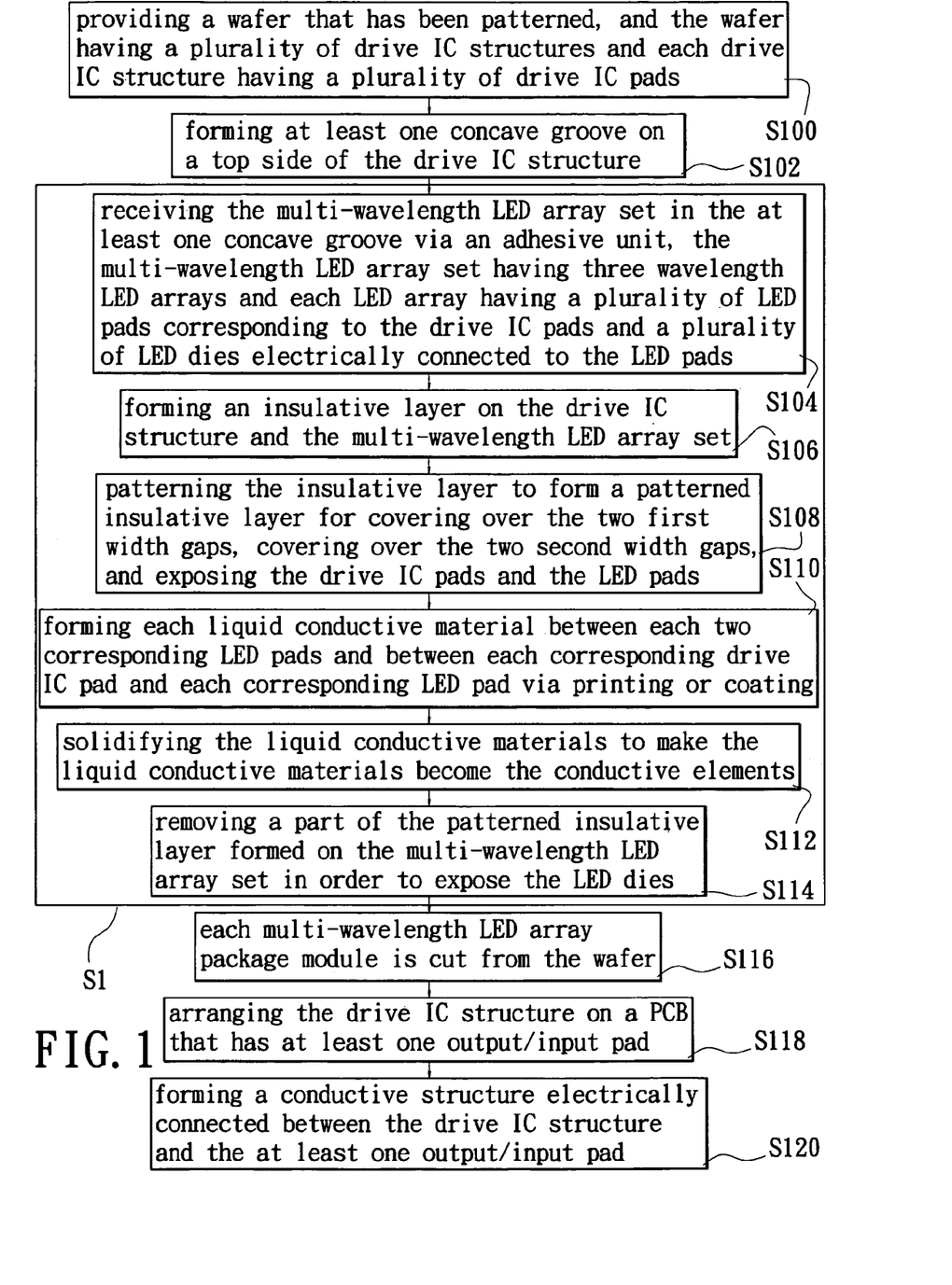
FIG. 1 is a flow chart of a multi-wavelength light-emitting module according to the first embodiment of the present invention.
Figure 2:
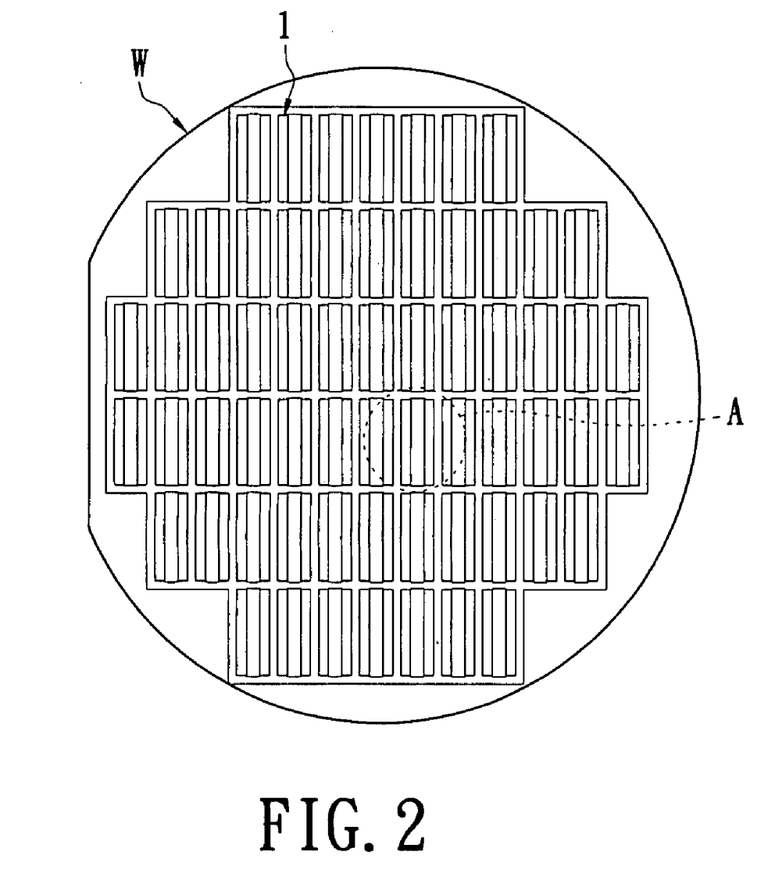
FIG. 2 is a schematic view of a wafer that has been patterned.
Figure 3:
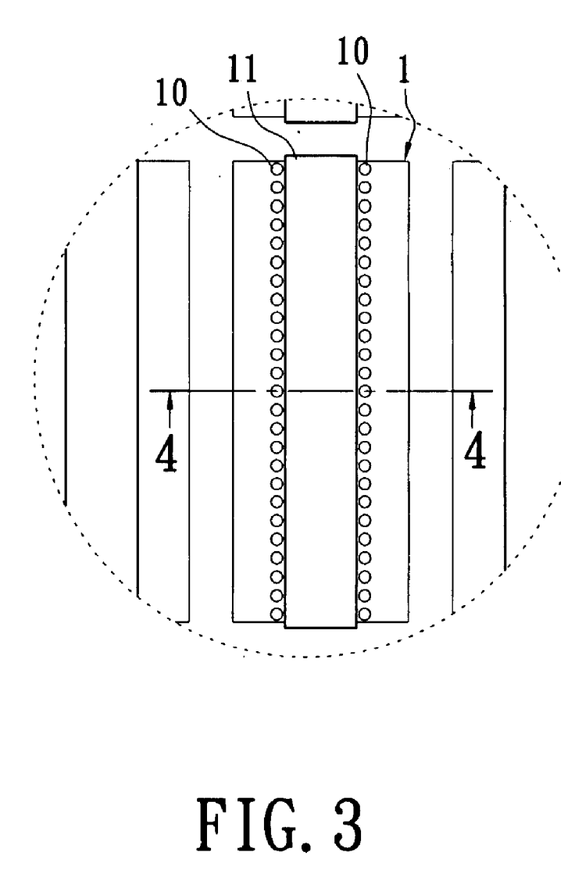
FIG. 3 is an enlarged view of part A of FIG. 2.
Figure 4:
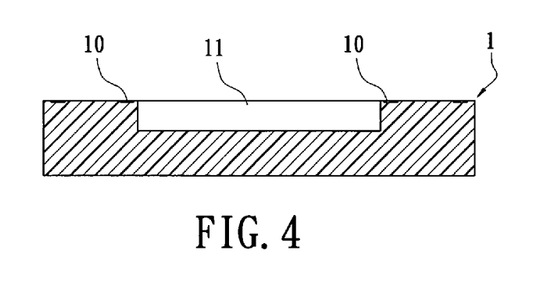
FIG. 4 is a cross-sectional view along line 4-4 of FIG. 2.
Figure 5A:
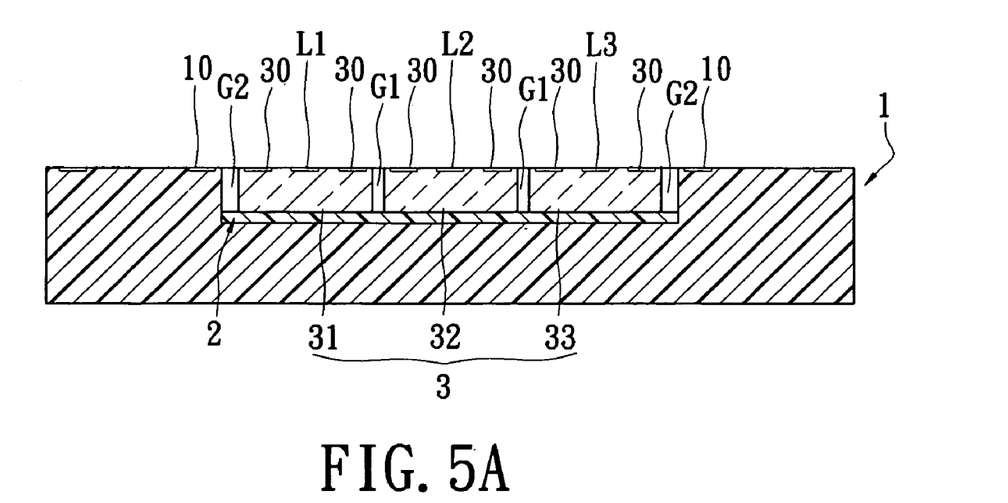
FIGS. 5A to 5G are cross-sectional, schematic views of a multi-wavelength light-emitting module according to the first embodiment of the present invention, at different stages of the packaging process, respectively.

Referring to FIG. 5A, the method includes receiving the multi-wavelength LED array set 3 in the at least one concave groove 11 via an adhesive unit 2, the multi-wavelength LED array set 3 having three wavelength LED arrays 31, 32, 33, and each LED array (31, 32, or 33) having a plurality of LED pads 30 corresponding to the drive IC pads 10 and a plurality of LED dies (L1, L2, or L3) electrically connected to the LED pads 30 (S104).

Figure 5B:
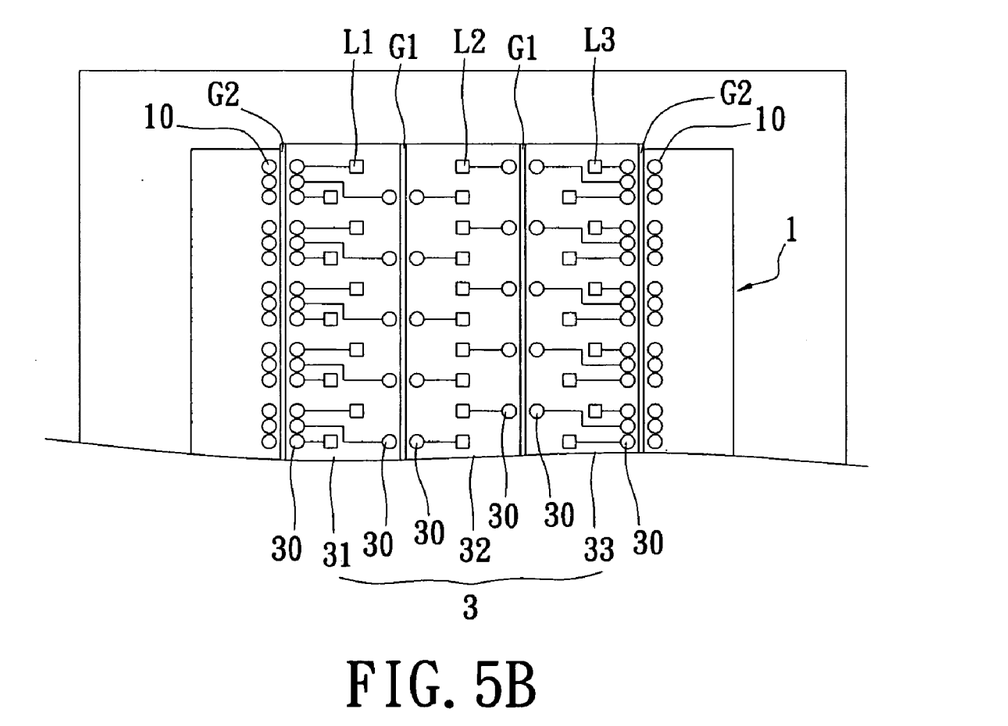

Referring to FIGS. 5A and 5B, the first wavelength, the second wavelength, and the three wavelength LED arrays 31, 32, 33 are parallel to each other. The second wavelength LED array 32 is arranged between the first wavelength LED array 31 and the third wavelength LED array 33. The drive IC pads 10 are arranged on the two sides of the drive IC structure. The first wavelength LED array 31 has a plurality of LED pads 30 arranged on two sides thereof and a plurality of LED dies L1 electrically connected with the corresponding LED pads 30 on one side thereof. The second wavelength LED array 32 has a plurality of LED pads 30 arranged on two sides thereof and a plurality of LED dies L2 electrically connected with the corresponding LED pads 30 on the two side thereof. The third wavelength LED array 33 has a plurality of LED pads 30 arranged on two sides thereof and a plurality of LED dies L3 electrically connected with the corresponding LED pads 30 on one side thereof.

Furthermore, there is a first width gap G1 formed between each two LED arrays. In other words, there is a first width gap G1 formed between the first wavelength LED array 31 and the second wavelength LED array 32, and there is another first width gap G1 formed between the second wavelength LED array 32 and the third wavelength LED array 33. Moreover, there are two second width gaps G2 formed between the multi-wavelength LED array set 3 and the drive IC structure 1. Each width gap G1 or G2 has a width is between 5 μm and 10 μm. Each width gap G1 or G2 has a height is about 10 μm.

Figure 5C:
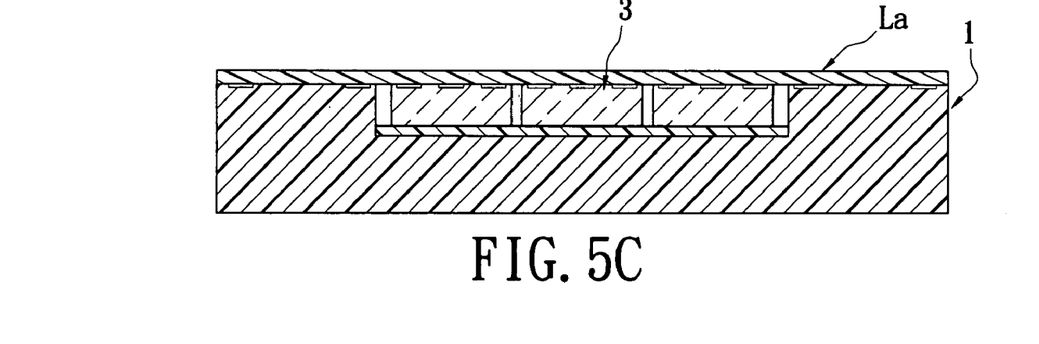

Referring to FIG. 5C, the method of the first embodiment further includes: forming an insulative layer La on the drive IC structure 1 and the multi-wavelength LED array set 3 (S106).

Figure 5D:
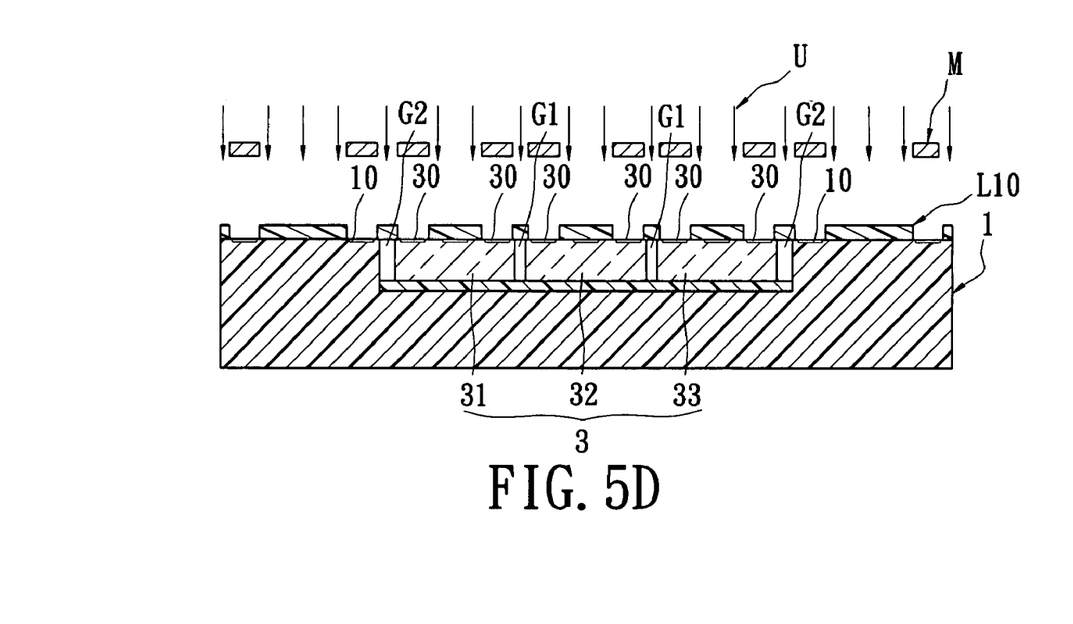

Referring to FIG. 5D, the method of the first embodiment further includes: patterning the insulative layer La to form a patterned insulative layer L10 for covering over the two first width gaps G1, covering over the two second width gaps G2, and exposing the drive IC pads 10 and the LED pads 30 (S108).

Figure 5E:
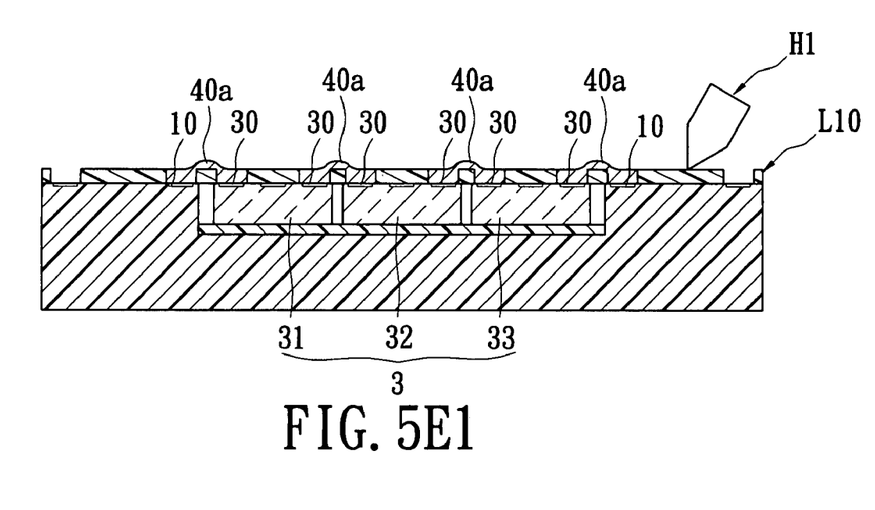

Referring to FIG. 5E1 (before curing), the method of the first embodiment further includes: forming each liquid conductive material 40a' between "each two corresponding LED pads 30 (it means between the first wavelength LED array 31 and the second wavelength LED array 32, and between the second wavelength LED array 32 and the third wavelength LED array 33)" and "each corresponding drive IC pad 10 and each corresponding LED pad 30" via printing or coating (S110) such as using a printing head H1.

Figure 5E:
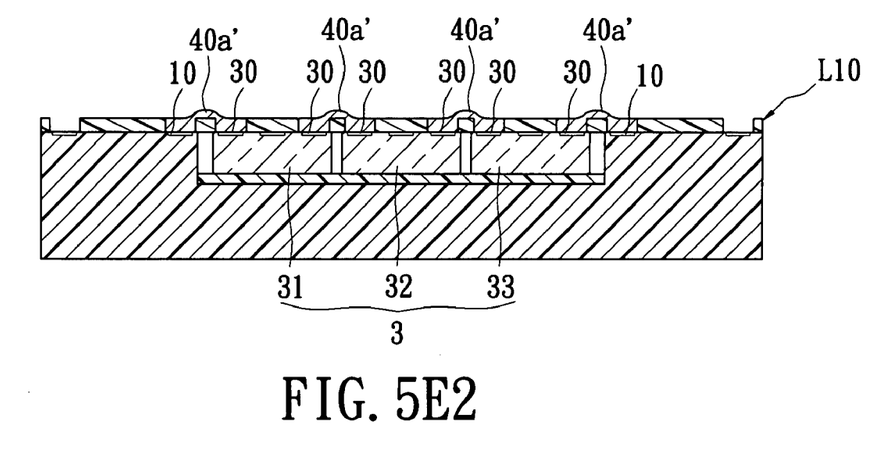

Referring to FIG. 5E2 (after curing), the method of the first embodiment further includes: solidifying the liquid conductive materials 40a' to make the liquid conductive materials 40a' become the conductive elements 40a" (S112). In other words, the conductive elements 40a' are formed between each two corresponding LED pads 30 and between each corresponding drive IC pad 10 and each corresponding LED pad 30.

In detailed description, a first part of the conductive elements 40a' are electrically connected between the corresponding drive IC pad 10 on one side of the drive IC structure 1 and the corresponding LED pad 30 on one side of the first wavelength LED array 31. A second part of the conductive elements 40a' are electrically connected between the corresponding LED pad 30 on the other side of the first wavelength LED array 31 and the corresponding LED pad 30 on one side of the second wavelength LED array 32. A third part of the conductive elements 40a' are electrically connected between the corresponding LED pad 30 on the other side of the second wavelength LED array 32 and the corresponding LED pad 30 on one side of the third wavelength LED array 33. A fourth part of the conductive elements 40a' are electrically connected between the corresponding LED pad 30 on the other side of the third wavelength LED array 33 and the corresponding drive IC pad 10 on the other side of the drive IC structure 1.

Figure 5F:
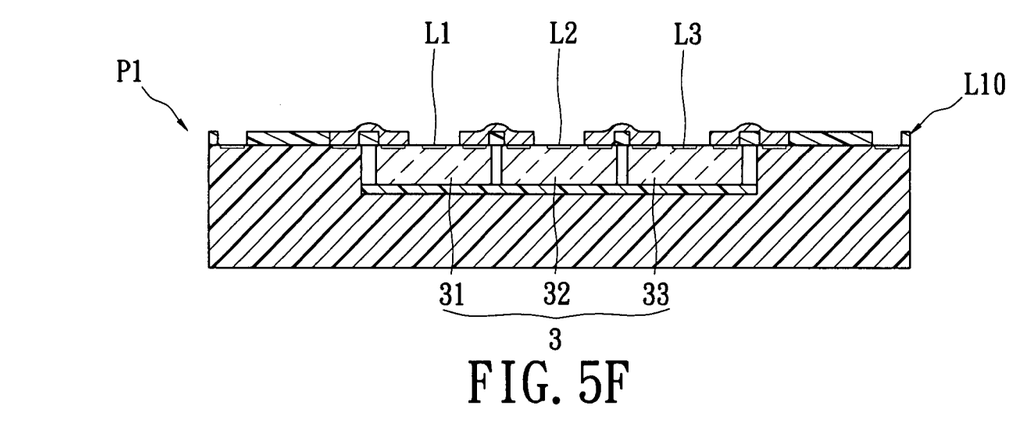

Referring to FIG. 5F, the method of the first embodiment further includes: removing a part of the patterned insulative layer L10 formed on the multi-wavelength LED array set 3 in order to expose the LED dies L1, L2, L3 (S114) to accomplish the multi-wavelength LED array package module P1.

Furthermore, after step S114, each multi-wavelength LED array package module P1 is cut from the wafer W (S116). It means that each drive IC structure 1 is cut from a wafer W that has been patterned.

Figure 5G:
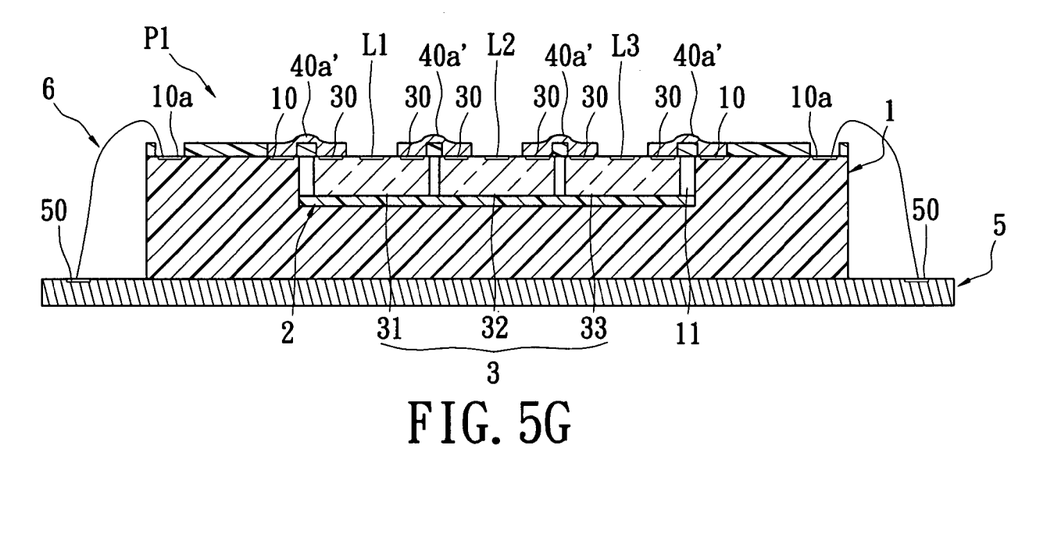

Referring to FIG. 5G, the method of the first embodiment further includes: arranging the drive IC structure 1 on a PCB 5 that has at least one output/input pad 50 (FIG. 5G shows a pair of output/input pads 50) (S118); and forming a conductive structure 6 electrically connected between the drive IC structure 1 and the at least one output/input pad 50 (FIG. 5G shows a pair of conductive structures 6) (S120). The conductive structure 6 can be a wire that is electrically connected between one power pad 10a of the drive IC structure 1 and the at least one output/input pad 50 (FIG. 5G shows two pairs of power pad 10a and the two output/input pads 50).

Referring to FIG. 5G again, the multi-wavelength LED array package module P1 includes a drive IC structure 1, an adhesive unit 2, a multi-wavelength LED array set 3, and a plurality of conductive elements 40a'. The drive IC structure 1 has at least one concave groove 11 and a plurality of drive IC pads 10 formed on a top side thereof. The adhesive unit 2 is formed between the multi-wavelength LED array set 3 and the drive IC structure 1. The multi-wavelength LED array set 3 is received in the at least one concave groove 11. The multi-wavelength LED array set 3 has a plurality of LED pads 30 and a plurality of LED dies L1, L2, L3 corresponding to the LED pads 30. The conductive elements 40a' is electrically connected between the drive IC structure 1 and the multi-wavelength LED array set 3 (Each conductive element 40a' is electrically connected between each corresponding drive IC pad 10 and each corresponding LED pad 30).

Figure 6:
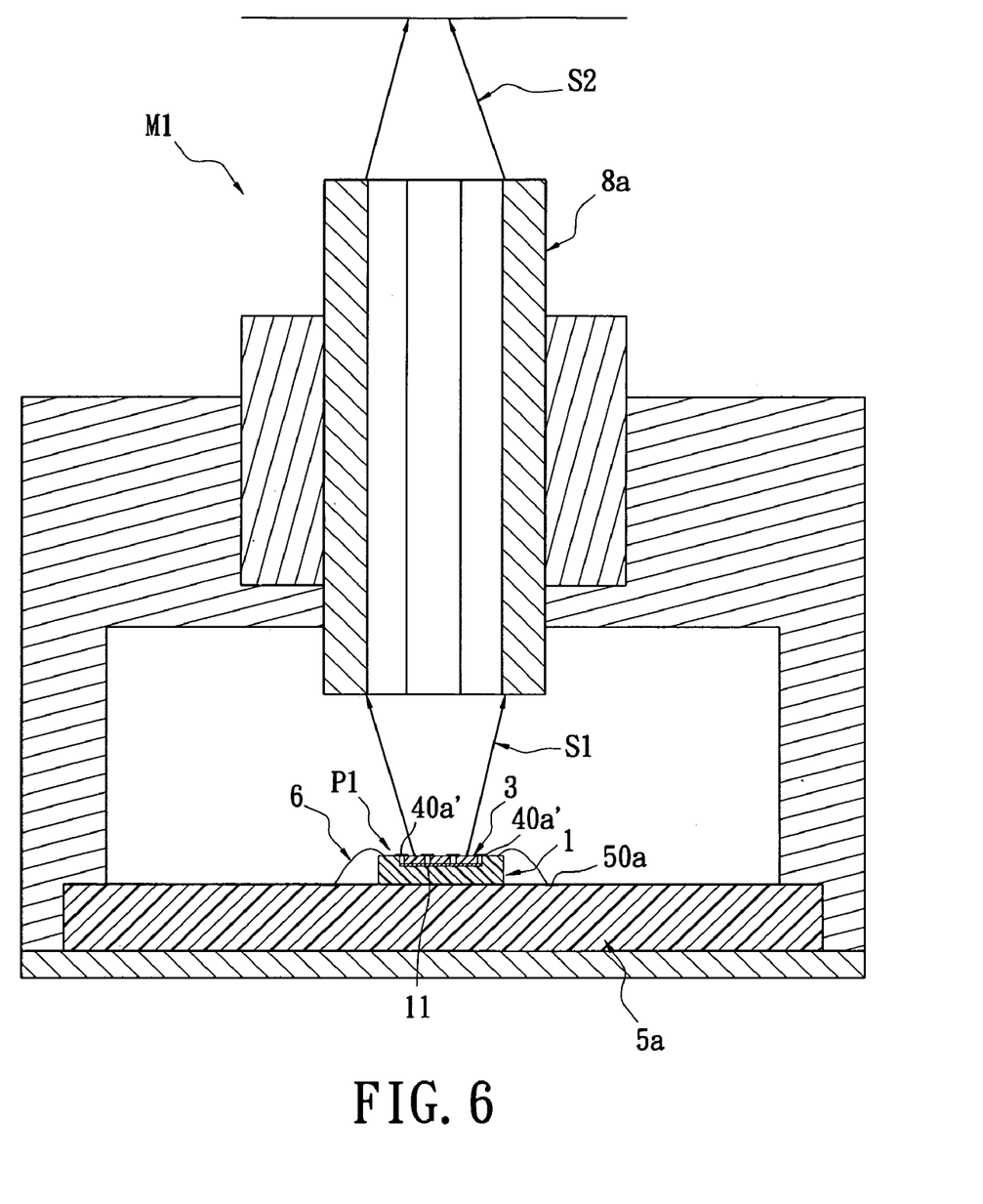
FIG. 6 is a cross-sectional, schematic view of a multi-wavelength light-emitting module according to the first embodiment of the present invention.

Referring to FIG. 6, the first embodiment of the present invention provides a multi-wavelength light-emitting module M1 that includes the multi-wavelength LED array package module P1 of FIG. 5F, a PCB 5a, a conductive structure 6, and an optical amplifier structure 8a. The multi-wavelength LED array package module P1 includes the drive IC structure 1, the multi-wavelength LED array set 3, and the conductive elements 40a'.

The PCB 5a has at least one input/output pad 50a. The drive IC structure 1 is disposed on the PCB 5a and has at least one concave groove 11 formed on top surface thereof. The conductive structure 6 is electrically connected between the drive IC structure 1 and the at least one input/output pad 50a. The multi-wavelength LED array set 3 is received in the at least one concave groove 11.

The conductive elements 40a' are electrically connected between drive IC structure 1 and the multi-wavelength LED array set 3, respectively. The optical amplifier structure 8a is disposed over the multi-wavelength LED array set 3 for receiving light sources S1 from the multi-wavelength LED array set 3. The light sources S1 are guided to form projected light sources S2 via the optical amplifier structure 8a that can be a SLA (semiconductor laser amplifier).

Figure 7:
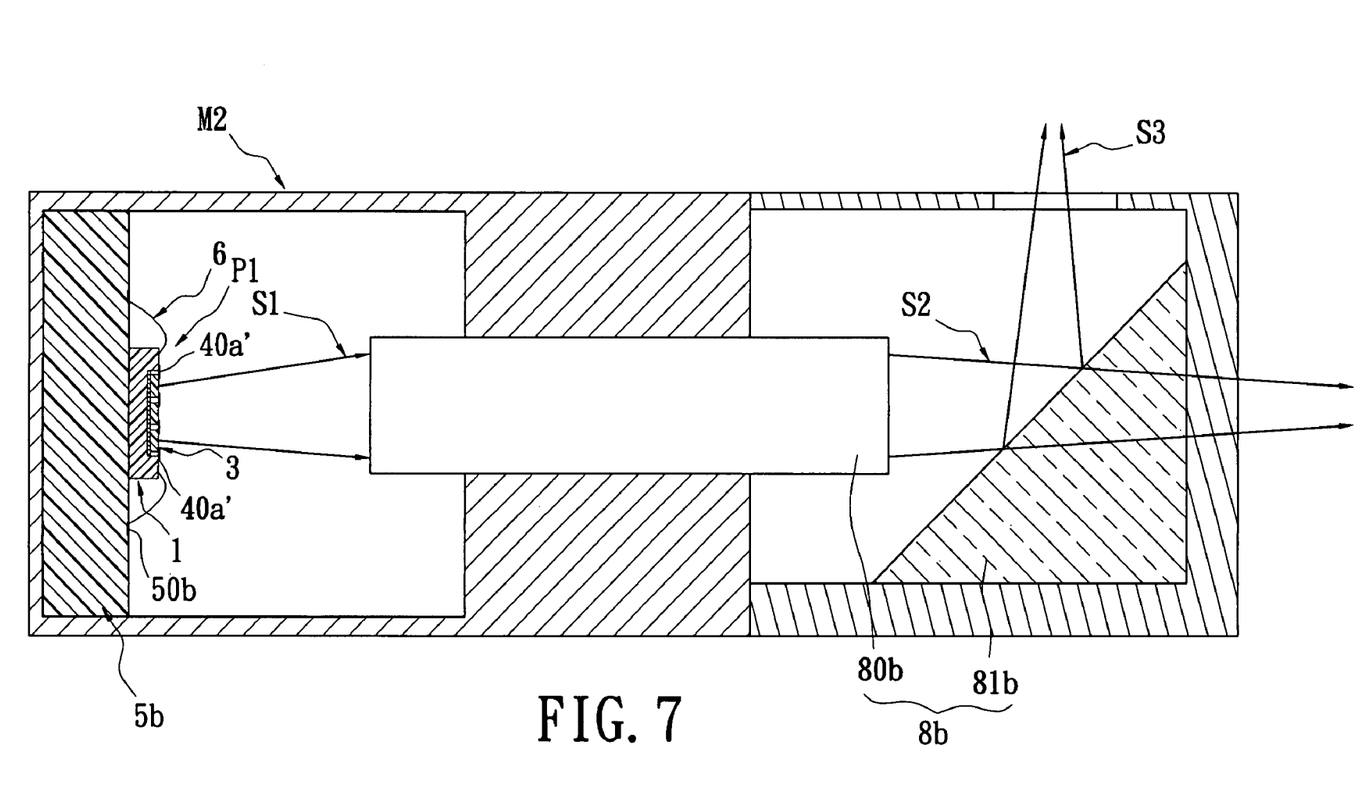
FIG. 7 is a cross-sectional, schematic view of a multi-wavelength light-emitting module according to the second embodiment of the present invention.

Referring to FIG. 7 (a PCB 5b having at least one input/output pad 50b), the difference between a multi-wavelength light-emitting module M2 of the second embodiment and the multi-wavelength light-emitting module M1 of the first embodiment is that in the second embodiment an optical amplifier structure 8b is composed of an optical amplifier 80b for receiving the light sources S1 from the multi-wavelength LED array set 3 and a reflective element 81b disposed beside the optical amplifier 80b. Hence, the light sources S1 from the multi-wavelength LED array set 3 are guided to form projected light source S2 via the optical amplifier 80b, and the projected light source S2 are reflected by an angle such as 90 degrees to form another projected light source S3 via the reflective element 81b.

Figure 8:
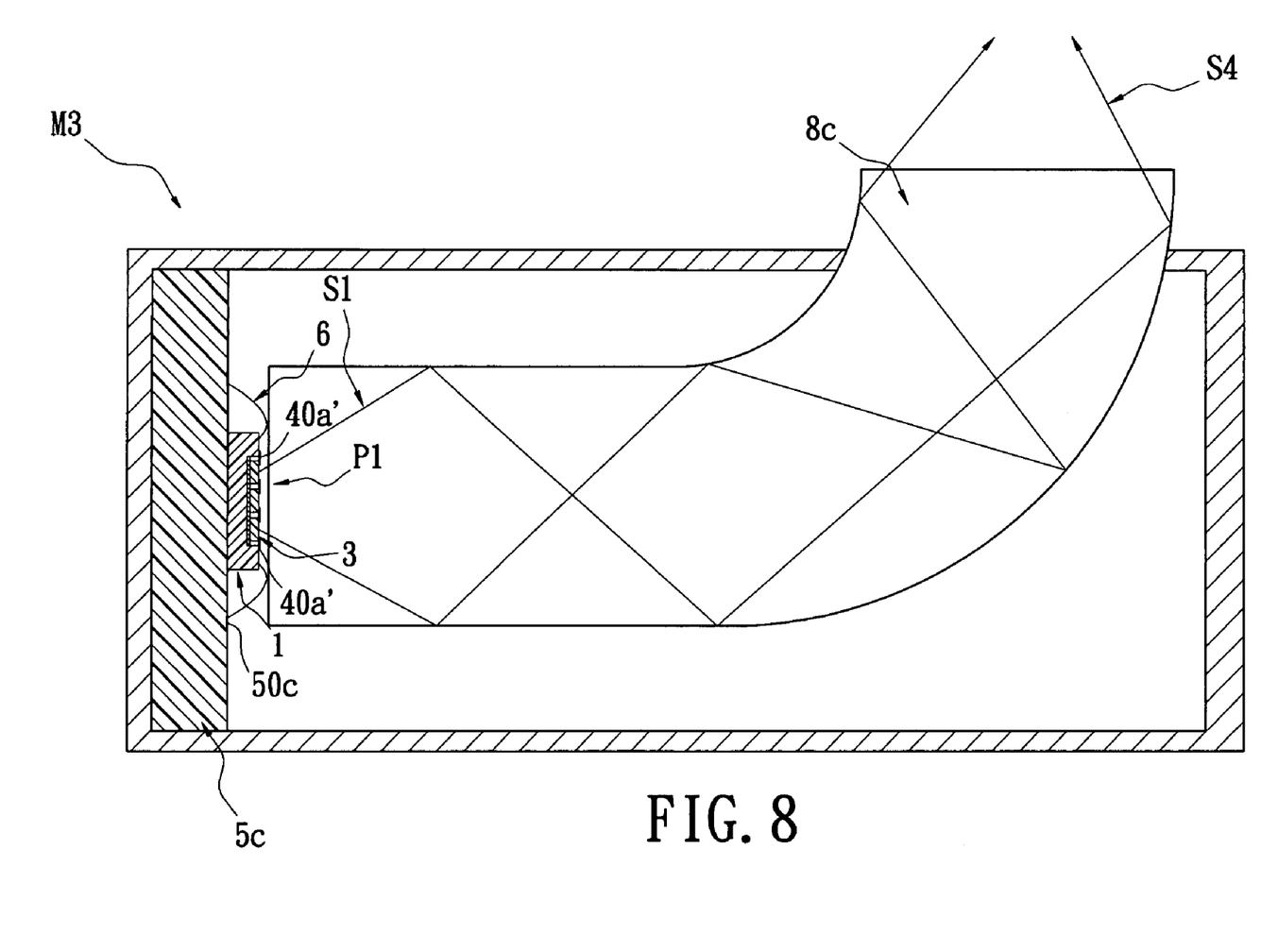
FIG. 8 is a cross-sectional, schematic view of a multi-wavelength light-emitting module according to the third embodiment of the present invention.

Referring to FIG. 8 (a PCB 5c having at least one input/output pad 50c), the difference between a multi-wavelength light-emitting module M3 of the third embodiment and other multi-wavelength light-emitting module (M1 or M2) is that in the third embodiment an optical amplifier structure 8c is a fiber optical tube for changing direction of the light sources S1 for example by 90 degrees. Hence, the light sources S1 from the multi-wavelength LED array set 3 are guided to form projected light source S4 projected by 90 degrees via optical amplifier structure 8c.

In conclusion, the multi-wavelength light-emitting modules (M1, M2, M3) are light exposure modules that can be applied to EPG (Electrophotography) printer.

Moreover, the multi-wavelength light-emitting module of the present invention can achieve high density electrical connection with 600~1200 dip via printing, coating, stamping or stencil printing. Hence, the present invention can reduce product size, material cost, and manufacturing cost due to high density electrical connection.

The conductive structures 6 are manufactured at the same time for electrically connecting between the multi-wavelength LED array set 3 and the drive IC structure 1 and between each two LED arrays. Hence, the present invention not only can reduce product size, material cost, and manufacturing cost, but also uses the same optical amplifier such as the SLA (semiconductor laser amplifier) for reducing the size of an optical module of a printer.

Moreover, the multi-wavelength light-emitting module of the present invention is not a mechanical scanner type but is a small-sized multi-wavelength light output device. The module of the present invention can applied to any portable electronic device such as notebook, laptop, PDA, and mobile phone etc. for achieving the purpose of movable color printing.

Although the present invention has been described with reference to the preferred best molds thereof, it will be understood that the invention is not limited to the details thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A multi-wavelength light-emitting module, comprising:
   (a) a PCB (5);
   (b) a drive IC chip (1) electrically disposed on the PCB and having at least one concave groove (11) formed on the top surface thereof, the drive IC chip having a first plurality of drive IC pads (10) formed on the top surface proximate to one side of the concave groove, and a second plurality of diver IC pads formed on the top surface proximate to the opposite side of the concave groove;
   (c) a multi-wavelength LED array set (3) arranged in the at least one concave groove,
       wherein the multi-wavelength LED array set includes at least three LED array modules (31, 32, 33) of different operating wavelengths, including a first LED array module, a second LED array module, and a third LED array module, each of the LED array module is of a rectangular shape and has two long sides and two short sides, wherein the at least three LED array modules are disposed side by side along the long sides of the array modules in the concave groove of the drive IC structure and separated from one another without immediate lateral contact, such that one long side of the first LED array module is adjacent to the one side of the concave groove having the first plurality of driver IC pads, and one long side of the third LED array module is adjacent to the opposite side of the concave groove having the second plurality of driver IC pads, and the second LED array module is disposed between the first LED array module and the third LED array module;
       wherein the top surface of the each array module is substantially flush with the top surface of the drive IC (1);
       wherein each of the LED array modules has a first plurality of LED pads and a second plurality of LED pads formed on the top surface proximate to the two long sides thereof, respectively, such that the first plurality of LED pads of the first LED array module correspond to the first plurality of driver IC pads of the driver IC chip, respectively, and the first plurality of the LED pads of the third LED array correspond to the second plurality of driver IC pads of the driver IC chip, respectively, the first plurality of LED pads of the second LED array module correspond to the second plurality of the LED pads of the first LED array module, respectively, and the second plurality of LED pads of the second LED array module correspond to the second plurality of LED pads of the third LED array module, respectively, and thus electrical connectivity between an adjacent LED array modules is enabled;
       wherein the first plurality of the LED pads of the first LED array module further includes a first group of LED pads electrically connected to the second plurality of the LED pads of the first LED array module across the width of the LED array module, and a second group of LED pads electrically connected to a plurality of LED dies formed on the first LED array module;
       wherein the first plurality of the LED pads of the third LED array module further includes a first group of LED pads electrically connected to the second plurality of the LED pads of the third LED array module across the width of the LED array module, and a second group of LED pads electrically connected to a plurality of LED dies formed on the third LED array module, respectively;

wherein the first plurality of LED pads and the second plurality of LED pads formed of the second LED array module are electrically connected to a plurality of LED dies formed on the second LED array module, respectively;

(d) an insulative layer (L10) selectively formed on the top surface of the drive IC and the array modules, wherein the insulative layer is patterned to expose the LED dies (L1) and the LED pads (30), (e) a plurality of conductive elements (40a), each correspondingly disposed on the insulative layer to enable electrical connectivity between the drive IC and the array modules; and (f) an optical amplifier structure arranged correspondingly above the LED array set (3) for receiving light from the multi-wavelength LED array set.

2. The multi-wavelength light-emitting module as claimed in claim 1, further comprising an adhesive element disposed between the multi-wavelength LED array set and the drive IC structure.

3. The multi-wavelength light-emitting module as claimed in claim 1, wherein the first, the second, and the third wavelength LED arrays modules are parallel to each other, and the second wavelength LED array is disposed between the first wavelength LED array and the third wavelength LED array.

4. The multi-wavelength light-emitting module as claimed in claim 3, further comprising two first width gaps with the predetermined distance formed between each two LED arrays, wherein each first width gap has a width between 5 μm and 10 μm.

5. The multi-wavelength light-emitting module as claimed in claim 4, further comprising two second width gaps formed between the multi-wavelength LED array set and the drive IC structure, wherein each second width gap has a width between 5 μm and 10 μm.

6. The multi-wavelength light-emitting module as claimed in claim 5, further comprising an insulative layer for covering the two first width gaps and the two second width gaps.

7. The multi-wavelength light-emitting module as claimed in claim 1, wherein the drive IC pads on the same side of the drive IC structure are arranged along a straight track, and the LED pads on the same side of the multi-wavelength LED array set are arranged along a straight track.

8. The multi-wavelength light-emitting module as claimed in claim 1, wherein the drive IC pads on the same side of the drive IC structure are arranged along a sawtooth-shaped track, and the LED pads on the same side of the multi-wavelength LED array set are arranged along a sawtooth-shaped track.

9. The multi-wavelength light-emitting module as claimed in claim 1, wherein the optical amplifier structure is a semiconductor laser amplifier (SLA).

10. The multi-wavelength light-emitting module as claimed in claim 1, wherein the optical amplifier structure comprises an optical amplifier for receiving light from the multi-wavelength LED array set and a reflective element disposed beside the optical amplifier.

11. The multi-wavelength light-emitting module as claimed in claim 1, wherein the optical amplifier structure is a fiber optical tube.

12. The multi-wavelength light-emitting module as claimed in claim 1, wherein the optical amplifier structure is a fiber optical tube for changing direction of the light.

* * * * *